US012728442B2

(12) United States Patent
Currey

(10) Patent No.: US 12,728,442 B2
(45) Date of Patent: Sep. 8, 2026

(54) MANIFOLD FOR A HYDRAULIC VIBRATION GENERATING DEVICE OR HYDRAULIC MOTOR

(71) Applicant: Albert Ben Currey, Phoenix, AZ (US)

(72) Inventor: Albert Ben Currey, Phoenix, AZ (US)

( * ) Notice: Subject to any disclaimer, the term of this patent is extended or adjusted under 35 U.S.C. 154(b) by 0 days.

(21) Appl. No.: 19/023,735

(22) Filed: Jan. 16, 2025

(65) Prior Publication Data

US 2025/0160159 A1 May 15, 2025

Related U.S. Application Data

(63) Continuation of application No. 18/310,954, filed on May 2, 2023, now Pat. No. 12,577,969, which is a (Continued)

(51) Int. Cl.

| | |
|---|---|
| ***B06B 1/18*** | (2006.01) |
| ***B01F 31/00*** | (2022.01) |
| ***B01F 35/32*** | (2022.01) |
| ***F15B 11/08*** | (2006.01) |
| ***F15B 15/20*** | (2006.01) |
| ***G06T 7/00*** | (2017.01) |
| ***G06T 7/70*** | (2017.01) |

(Continued)

(52) U.S. Cl.

CPC .............. *B06B 1/186* (2013.01); *B01F 31/70* (2022.01); *B01F 35/32045* (2022.01); *F15B 11/08* (2013.01); *F15B 15/20* (2013.01); *G06T 7/0004* (2013.01); *G06T 7/70* (2017.01); *H10K 59/131* (2023.02); *H10K 71/70* (2023.02)

(58) Field of Classification Search

CPC .... B06B 1/186; B01F 31/70; B01F 35/32045; F15B 11/08; F15B 15/20

USPC .................................................. 366/124–126

See application file for complete search history.

(56) References Cited

U.S. PATENT DOCUMENTS 2,215,888 A * 9/1940 Swarthout ............... E04G 21/08 404/115

2,970,570 A 2/1961 Hill (Continued)

FOREIGN PATENT DOCUMENTS

DE 29922369 3/2000

DE 29922369 U1 * 3/2000 ............. B06B 1/186

*Primary Examiner* — Charles Cooley

(74) *Attorney, Agent, or Firm* — Schmeiser, Olsen & Watts LLP

(57) ABSTRACT

A hydraulic vibration generation device or hydraulic motor is provided. The device includes a manifold having an inner volume with a pressure chamber formed in the inner volume, a fluid inlet orifice and a fluid outlet orifice. The device further includes a vibration generating member having a grooved drive and an off-center weight and retaining plates. The inner volume receives the vibration generating member within it. The vibration generating member rotates and generates vibration in response to hydraulic fluid flowing into the manifold through the inlet orifice and directed through the pressure chamber, relieves pressure upon exiting the pressure chamber into a pressure relief channel and out of the manifold through the outlet orifice. Also provided a hydraulic motor with a same manifold and pressure chamber, but with a power generating member having the same groove drive without an off-center weight. Rotation of the power generating member generates power.

4 Claims, 8 Drawing Sheets

Related U.S. Application Data continuation-in-part of application No. 18/184,161, filed on Mar. 15, 2023, now Pat. No. 11,826,782.

(51) Int. Cl.
*H10K 59/131* (2023.01)
*H10K 71/70* (2023.01)

(56) References Cited

U.S. PATENT DOCUMENTS 3,235,230 A * 2/1966 Malan .................... B06B 1/186 366/125
3,292,835 A 12/1966 Gunter
3,528,646 A 9/1970 Best
3,866,480 A 2/1975 Elliston
4,039,167 A * 8/1977 Zinga ........................ B06B 1/16 366/125
4,057,222 A * 11/1977 Lyle .......................... F03C 2/08 418/171
4,472,980 A 9/1984 Wadensten
4,590,814 A 5/1986 Wadensten
4,604,029 A 8/1986 Fink
5,314,305 A 5/1994 Fink
6,244,815 B1 6/2001 Treat
6,261,059 B1 7/2001 Wadensten
10,610,896 B1 * 4/2020 Currey .................... B06B 1/186
10,987,698 B2 * 4/2021 Currey .................... B06B 1/186
11,325,156 B2 * 5/2022 Currey ...................... F03B 1/02
11,465,178 B2 * 10/2022 Currey .................... B06B 1/186
11,773,556 B2 10/2023 Currey
11,826,782 B1 * 11/2023 Currey .................... B01F 31/70
12,208,418 B2 * 1/2025 Currey ................. H10K 59/131
2001/0004438 A1 6/2001 Reis
2018/0292501 A1 10/2018 Neumann et al.
2021/0060614 A1 * 3/2021 Currey .................... B06B 1/186
2021/0060615 A1 * 3/2021 Currey .................... B06B 1/186
2021/0205847 A1 * 7/2021 Currey .................... B06B 1/186
2021/0370349 A1 * 12/2021 Currey ...................... F03B 1/02
2024/0307920 A1 * 9/2024 Currey .................... B01F 31/70
2024/0309895 A1 * 9/2024 Currey .................... B06B 1/186
2025/0160159 A1 * 5/2025 Currey .................. H10K 71/70

* cited by examiner

MANIFOLD FOR A HYDRAULIC VIBRATION GENERATING DEVICE OR HYDRAULIC MOTOR

CROSS REFERENCE TO RELATED APPLICATION[S]

This application is a continuation of earlier U.S. Utility patent application Ser. No. 18/310,594, filed May 2, 2023, which is a continuation-in-part of the earlier U.S. Utility patent application Ser. No. 18/184,161, filed Mar. 15, 2023, now U.S. Pat. No. 11,826,782, issued Nov. 28, 2023, the disclosures of which is hereby incorporated entirely herein by reference.

BACKGROUND OF THE INVENTION

Technical Field

This invention relates generally to a vibration generating device or hydraulic motor, and more particularly to a manifold for use with a vibration generating device or hydraulic motor.

State of the Art

There are several material processing products that utilize vibration during operation, such as, but not limited to screening of material implementations. Other devices also utilize vibratory devices in the operation and utilization. These devices are generally electromechanical or mechanical systems. They include gears and other components that are prone to failure.

Further, there are also several material processing products, as well as other types of products that utilize motors. These motors are generally electromechanical systems that operate by drawing power from a power source to drive an external component. There are limitations, including limitations on the access to or supply of power from power sources and components that are prone to failure.

Therefore, there is a need for an improved manifold for use with a hydraulic vibration generating device or a hydraulic motor.

SUMMARY OF THE INVENTION

The present invention relates to a hydraulic vibration generation device comprising: a manifold comprising a fluid inlet orifice; a fluid outlet orifice; and an inner volume, wherein the inner volume defined by a cylindrical surface with a diameter; a vibration generating member coupled within the inner volume of the manifold, wherein the vibration generating member is a shaft having a diameter that is smaller than the diameter of the cylindrical surface of the manifold, wherein the vibration generating member further comprises: a grooved drive comprising a plurality of recessed grooves formed in an outer surface of the vibration generating member, wherein the recessed grooves of the plurality of recessed grooves are evenly spaced around the circumference of the vibration generating member; and a pressure chamber formed in the manifold, the pressure chamber comprising: a pressure channel formed in the cylindrical surface of the inner volume, the pressure channel overlapping the inlet orifice and extends below the inlet orifice; and a seal extending form a first end of the pressure channel to above the inlet orifice and on either side of the pressure channel, wherein: the inner volume receives the vibration generating member within the inner volume locating the grooved drive adjacent the pressure channel such that flow of hydraulic oil is inhibited between the vibration generating member and the seal and directed through the pressure channel while engaging the grooved drive; and the vibration generating member rotates and generates vibration in response to hydraulic oil flowing through the inlet orifice and into the pressure channel, through the pressure channel engaging the grooved drive to rotate the vibration generating member, out of the pressure channel where pressure is relieved as the hydraulic oil flows into and through a pressure relief channel formed in the cylindrical surface and extending from the pressure channel past the outlet orifice, and out of the inner volume through the outlet orifice.

Another embodiment includes a method of operation of a hydraulic vibration generation device, the method comprising: providing manifold comprising a fluid inlet orifice, a fluid outlet orifice, an inner volume, and a pressure chamber within the inner volume; providing a vibration generating member within the inner volume of the manifold; flowing hydraulic oil into the manifold through the inlet orifice and into the pressure chamber; directing the hydraulic oil through the pressure chamber to engage the vibration generating member to rotate the vibration generating member to generate vibration; and flowing hydraulic oil from the pressure chamber and out of the manifold through the outlet orifice.

Another embodiment includes a hydraulic motor comprising: a manifold comprising a fluid inlet orifice; a fluid outlet orifice; and an inner volume, wherein the inner volume defined by a cylindrical surface with a diameter; a power generating member coupled within the inner volume of the manifold, wherein the power generating member is a shaft having a diameter that is smaller than the diameter of the cylindrical surface of the manifold, wherein the power generating member further comprises: a grooved drive comprising a plurality of recessed grooves formed in an outer surface of the power generating member, wherein the recessed grooves of the plurality of recessed grooves are evenly spaced around the circumference of the power generating member; and a pressure chamber formed in the manifold, the pressure chamber comprising: a pressure channel formed in the cylindrical surface of the inner volume, the pressure channel overlapping the inlet orifice and extends below the inlet orifice; and a seal extending form a first end of the pressure channel to above the inlet orifice and on either side of the pressure channel, wherein: the inner volume receives the power generating member within the inner volume locating the grooved drive adjacent the pressure channel such that flow of hydraulic oil is inhibited between the power generating member and the seal and directed through the pressure channel while engaging the grooved drive; and the power generating member rotates and generates power in response to hydraulic oil flowing through the inlet orifice and into the pressure channel, through the pressure channel engaging the grooved drive to rotate the power generating member, out of the pressure channel where pressure is relieved as the hydraulic oil flows into and through a pressure relief channel formed in the cylindrical surface and extending from the pressure channel past the outlet orifice, and out of the inner volume through the outlet orifice.

Yet another embodiment includes a method of operation of a hydraulic motor, the method comprising: providing manifold comprising a fluid inlet orifice, a fluid outlet orifice, an inner volume, and a pressure chamber within the inner volume; providing a power generating member within the inner volume of the manifold; flowing hydraulic oil into the manifold through the inlet orifice and into the pressure chamber; directing the hydraulic oil through the pressure chamber to engage the power generating member to rotate the power generating member to generate power; and flowing hydraulic oil from the pressure chamber and out of the manifold through the outlet orifice.

The foregoing and other features and advantages of the present invention will be apparent from the following more detailed description of the particular embodiments of the invention, as illustrated in the accompanying drawings.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF EMBODIMENTS OF THE INVENTION

Figure 1:
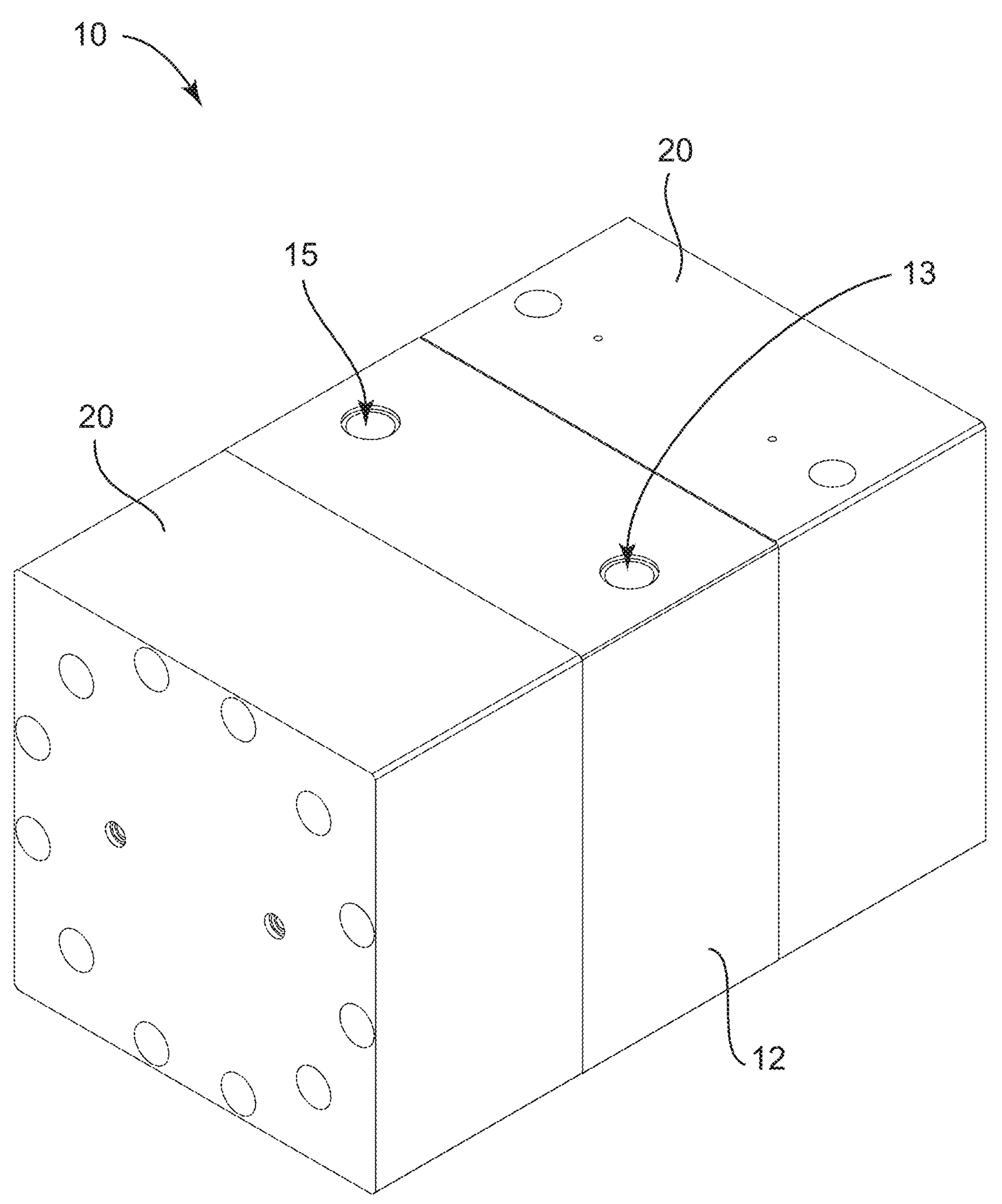
FIG. 1 is a perspective view of a hydraulic vibration generating device according to an embodiment.
Figure 2:
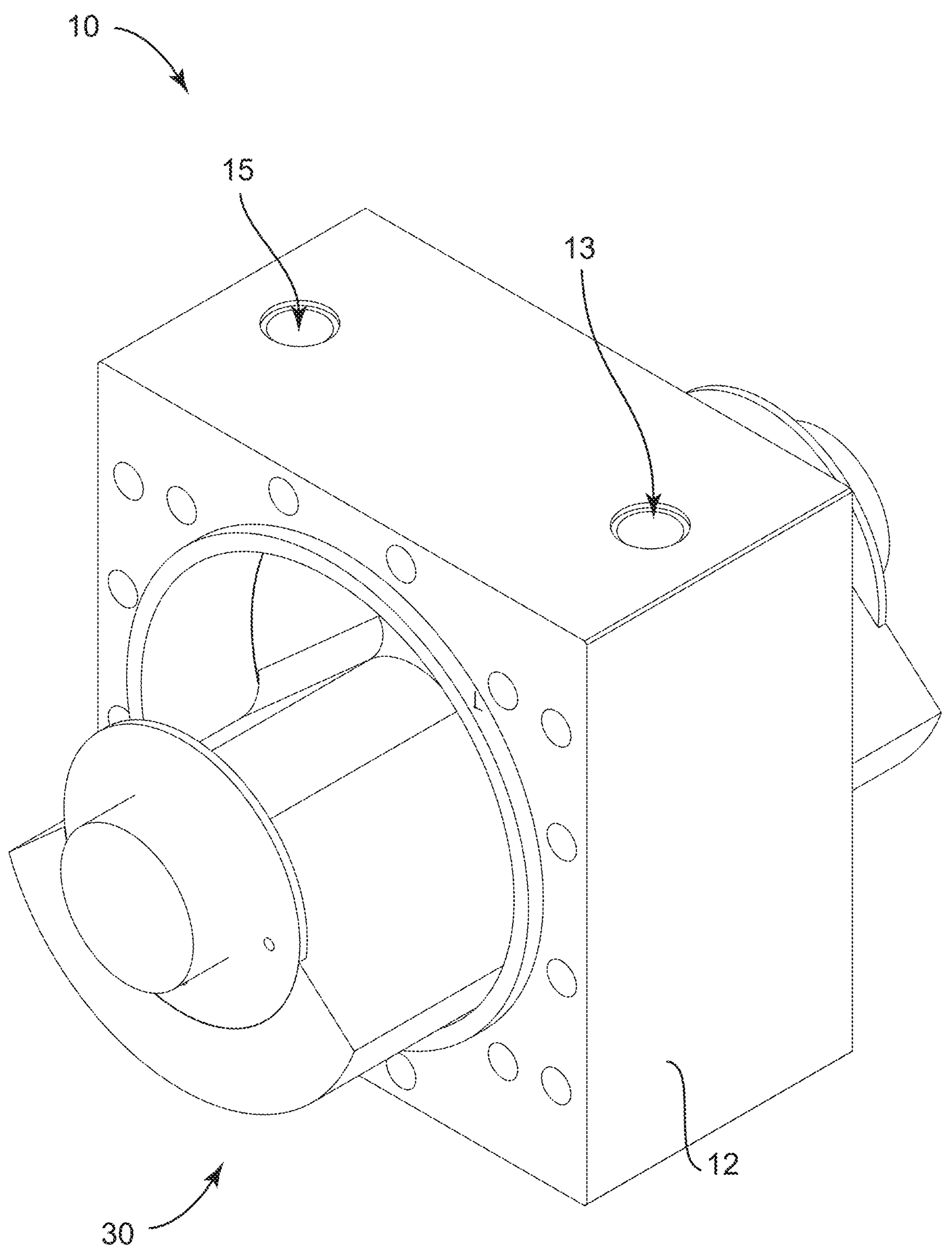
FIG. 2 is a perspective view of a manifold and a vibration generating member of a hydraulic vibration generating device according to an embodiment.

As discussed above, embodiments of the present invention relate to a hydraulic driven vibration generating device or hydraulic motor.

Referring to the drawings, FIGS. 1-7B depict an embodiment of a hydraulic driven vibration generating device 10. The device 10 generally comprises a manifold 12, retaining plates 20, and a vibration generating member 30, wherein the vibration generating member 30 is retained within the manifold 12 by coupling the retaining plates 20 to the manifold 12.

The manifold 12 may be a block shape or other shape that is needed for the operation of the vibration generating device 10. The manifold 12 may comprise an inner volume 14 that may be defined by a cylindrical surface 11 with a diameter forming an aperture extending through the manifold 12, wherein the aperture may be bounded on each end by coupling the retaining plates 20 on opposing side of the manifold 12. The manifold 12 may also comprise an inlet orifice 13 and an outlet orifice 15. This allows hydraulic fluid to flow into the manifold 12 through the inlet orifice 13 and into the inner volume 14 to engage and rotate the vibration generating member 30, and then out through the outlet orifice 15. The outlet orifice 15 has a larger opening to the inner volume 14 than the inlet orifice 13 in order to remove fluid from the inner volume as quickly as possible. In some embodiments, the size of the outlet orifice 15 may vary and the shape of the outlet orifice 15 may vary depending on the size and use application of the vibration generating device 10. An inlet hose adapter (not shown) may be coupled between the inlet orifice 13 and an inlet hose and an outlet hose adapter (not shown) may be coupled between the outlet orifice 15 and an outlet hose, thereby allowing a fluid inlet hose and a fluid outlet hose to be coupled to the manifold 12 for operation of the device 10.

Figure 7:
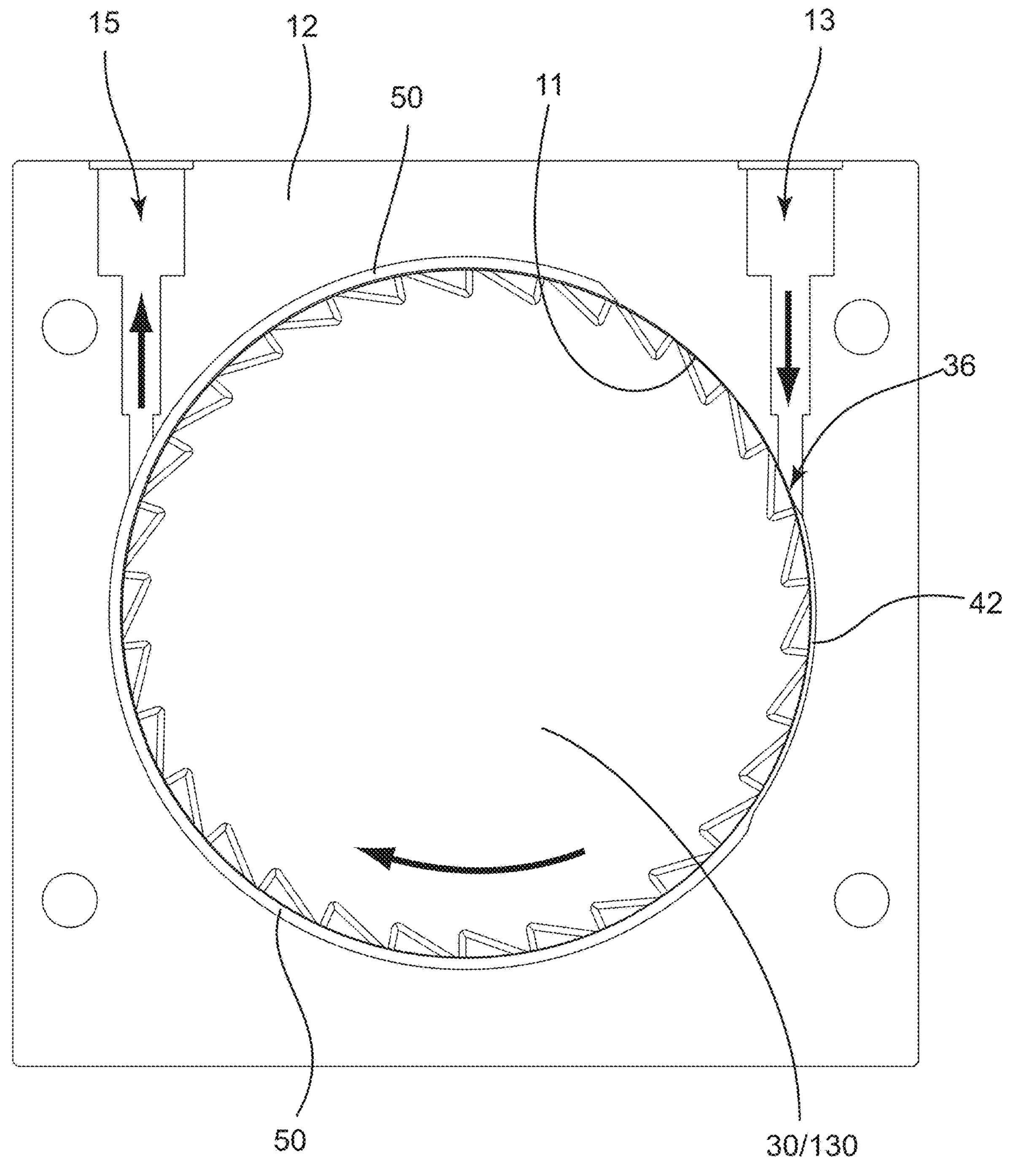
FIG. 7 is a section view of a manifold for use with a hydraulic vibration generating device or hydraulic motor according to an embodiment.

The vibration generating member 30, formed as a spool, may comprise a shaft 34 having voids 32 formed or cut into a portion or portions of the shaft 34. The voids 32 reduce weight on one side of the shaft 34 thereby creating a weighted side of the shaft 34, wherein the center of gravity is offset from the axis and is located toward the weighted side of the shaft 34 and not on the axis of the shaft, thereby making the weight "off-center". The shaft 34 of the vibration generating member 30 is rotatable within the inner volume 14 of the manifold 12. The rotation of the shaft 34 with the off-center weight or offset center of gravity results in vibration of the manifold 12. As shown in FIG. 7, the diameter of the shaft 34 is smaller than the diameter of the cylindrical surface 11 of the inner volume 14, wherein the difference between the diameter of the shaft 34 and the diameter of the cylindrical surface 11 of the inner volume 14 is such to inhibit hydraulic oil from traveling between the shaft 34 and the cylindrical surface 11.

The vibration generating member 30, formed as a spool, comprises a grooved drive 36 formed in the outer surface of the shaft 34 around a circumference of the shaft 34. The grooved drive 36 comprises a plurality of grooves 38 formed in the outer surface of the shaft 34 and are evenly spaced around the circumference of the shaft 34, such that hydraulic fluid may engage the grooves 38 to rotate the shaft 34. The vibration generating member 30 may also include ends 39 that engage a bearing and cover plates 35 that are coupled around the ends 39 to separate the ends and cover the bearings that are within the retaining plates 20

The manifold 12 comprises a pressure chamber 40. The pressure chamber 40 may comprise a pressure channel 42 formed in the cylindrical surface 11 of the inner volume 14. A first end 43 of the pressure channel 42 is located in a position that overlaps the inlet orifice 13 between the lower end 17 and the upper end 19 of the inlet orifice 13 without extending past the upper end 19. The pressure channel 42 then extends past the lower end 17 until terminating at a second end 45 of the pressure channel 42. The pressure channel 42 forms side walls 44 and the length of the side walls 44 may be equal along the length of the pressure channel 42.

The diameter of the shaft 34 is smaller than the diameter of the inner volume 14 that forms a seal extending form the first end 43 of the pressure channel 42 to above the upper end 19 of the inlet orifice 13 and on either side of the pressure channel 42. The seal does not include the pressure channel 42 and operates to form a space between the cylindrical surface 11 of the inner volume 14 and the shaft 34 that is small enough to inhibit hydraulic oil from traveling up and around the shaft 34 in a direction opposite of the direction of rotation of the shaft 34. This results in reduction of pressure in a direction opposing the direction of rotation of the shaft 34 and allows the shaft 34 to rotate in the proper direction more easily than if the seal portion did not exist. The pressure channel 42 and seal forms the pressure chamber 40 between the groove drive 36 of the shaft 34 and the pressure channel 42, thereby ensuring that the pressure being produced by pumping of hydraulic oil into the inlet orifice 13 is located within the space bound on four sides by the pressure channel 42 and on a fifth side by the groove drive 36 of the shaft 34, with only one exit for the hydraulic oil, the exit located at the lower end 45 of the pressure channel 42.

Figure 4:
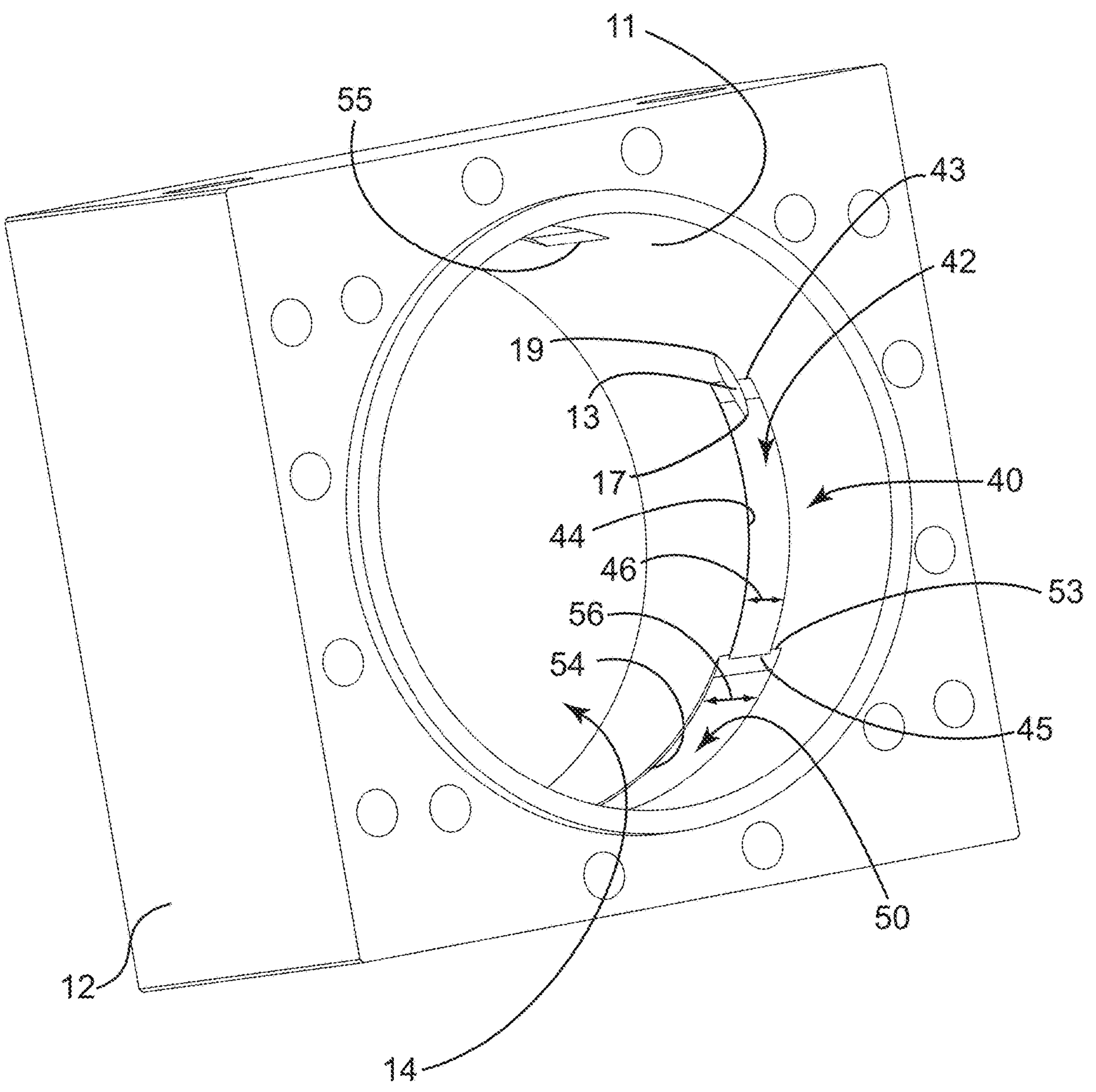
FIG. 4 is a perspective view of a manifold for use with a hydraulic vibration generating device or hydraulic motor according to an embodiment.
Figure 5:
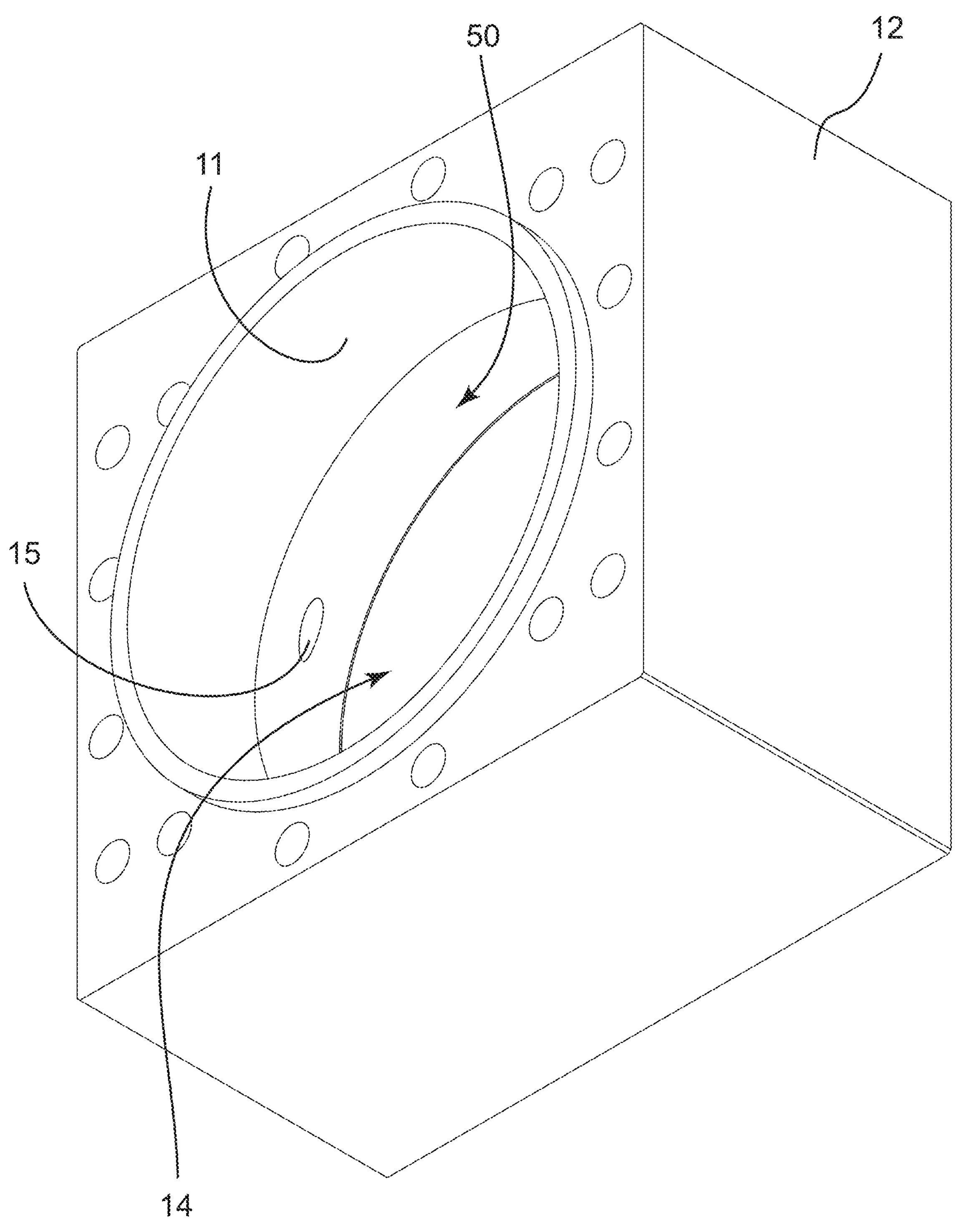
FIG. 5 is a perspective view of a manifold for use with a hydraulic vibration generating device or hydraulic motor according to an embodiment.

The length of the pressure channel 42 may have varying lengths. In embodiments, the length the pressure channel 42 extending below the inlet orifice may be at least as long as at least two grooves 38, as shown in FIGS. 4, 6A and 7. However, various lengths of pressure channel 42 may be utilized, such as shown in FIG. 6B, and the length may extend between the inlet orifice 13 and the outlet orifice 15 in the direction of rotation. Additionally, in embodiments, a width 46 of the pressure channel 44 may be equal to or less than a width 37 of the grooves 38 of the groove drive 36 of the shaft 34.

Figure 6:
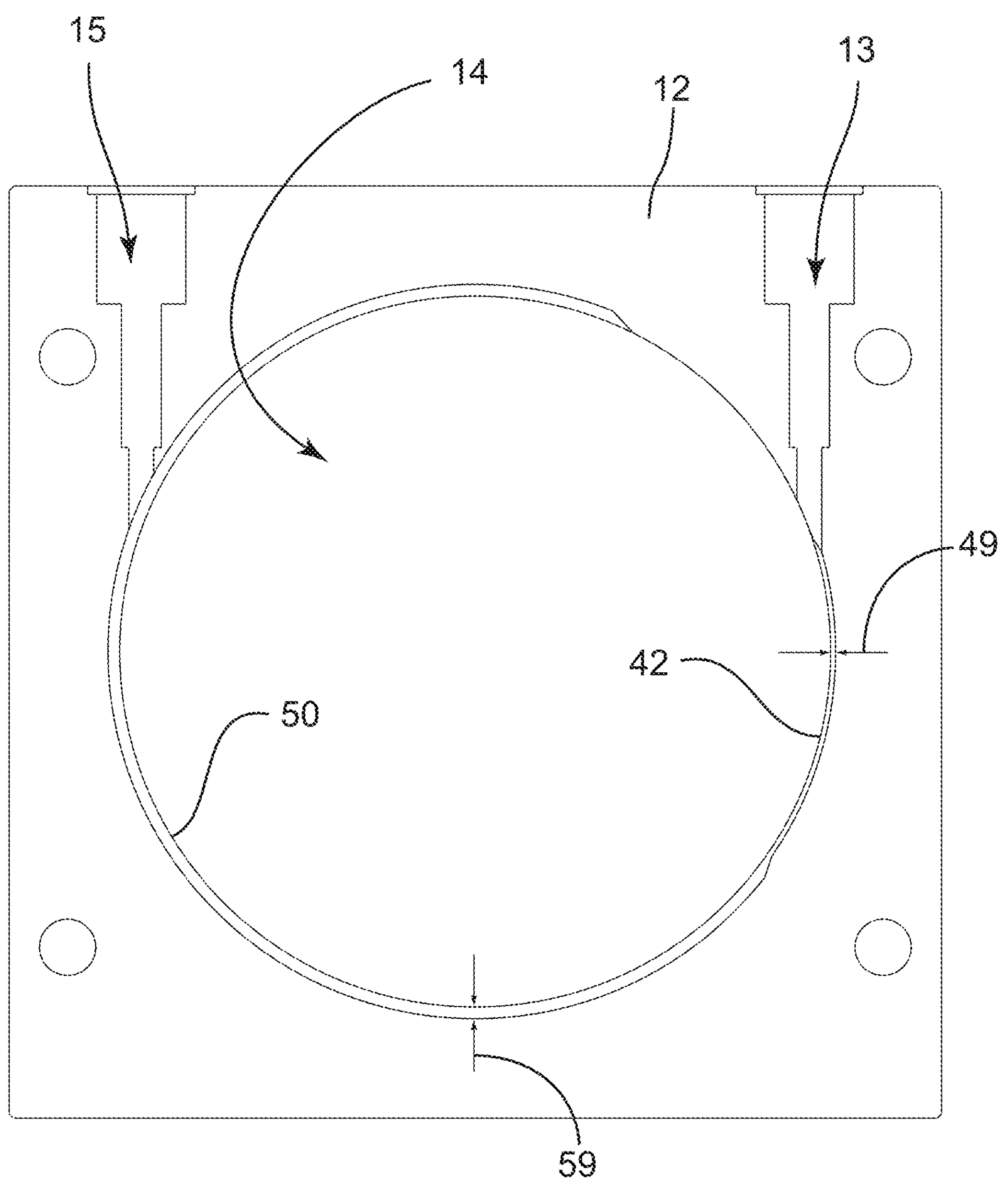
FIG. 6 is a side view of a manifold for use with a hydraulic vibration generating device or hydraulic motor according to an embodiment.

The manifold 12 may further include a pressure relief channel 50 formed in cylindrical surface 11 of the inner volume 14, wherein the pressure relief channel 50 comprises a depth 59 that is greater than the depth 49 of the pressure channel 42, as shown in FIGS. 6 and 7, depicting exaggerated depths 59 and 49 of the pressure relief channel 50 and the pressure channel 42 respectively to better depict the differences in the depths of the channels. A first end 53 of the pressure relief channel 50 is located in a position that is adjacent to and overlaps or abuts the second end 45 of the pressure channel 42. The pressure relief channel 50 then extends past the outlet orifice 15 until terminating at a second end 55 of the pressure relief channel 50. The pressure relief channel 50 forms side walls 54 and the length of the side walls 54 may be equal along the length of the pressure relief channel 50. Further, the width 56 of the pressure relief channel 50 is greater than the width 46 of the pressure channel 42. Because of the greater width 56 of the pressure relief channel 50, upon exiting the pressure channel 42, the hydraulic oil may be dispersed into the pressure relief channel 50 and flow out of the manifold 12 through the outlet orifice 15. This pressure chamber 40 operates to reduce pressure acting on the shaft 34 in a direction opposite the direction of rotation, thereby adding efficiency and increased performance of the vibration generating member 30.

Without the pressure chamber 40, the block pressure fights against the rotation of the shaft 34 and prevents the shaft 34 from rotating, particularly when the system and hydraulic oil is cold. With the pressure chamber 40, the block pressure is reduced and essentially all of the reduction of block pressure is recovered in the pressure chamber 40 and directed in the path of least resistance through the pressure channel 42 to engage the grooved drive 36 of the shaft 34.

In operation, hydraulic oil is flowed into the inlet orifice 13 and engages the grooves 38 of the groove drive 36 of the shaft 34 of the vibration generating member 30. The hydraulic oil engages the grooves 38 within the pressure chamber, wherein the pressure of the hydraulic oil, because of the small pace between the groove drive 36 and the pressure channel 44, is higher than the pressure within the pressure relief channel 50 and the rest of the block and operates to rotate the vibration generating member 30 in a direction of rotation toward the outlet orifice 15. As the hydraulic oil travels through the pressure channel 42 rotating the shaft 34, the hydraulic oil exits the pressure chamber 40 at the lower end 45 of the pressure channel 42 and the pressure is relieved into the pressure relief channel 50 and the hydraulic oil can then exit the inner volume 14 of the manifold 12 through the outlet orifice 15. The rotation of the vibration generating device 13 creates vibration that can be utilized in various applications.

The manifold 12 may have various apertures and recesses that are utilized to couple the retaining plate 20 to the manifold 12 and for use of couplers to couple the manifold 12 to an external device to vibrate. While these apertures and recesses are shown, they are only for exemplary purposes and should not be considered a limitation, but simply as one way that certain components of a hydraulic vibration generating device 10 may be coupled together. Other forms of coupling components together are contemplated and may be used without departing from the scope of the invention and claims.

Figure 3A:
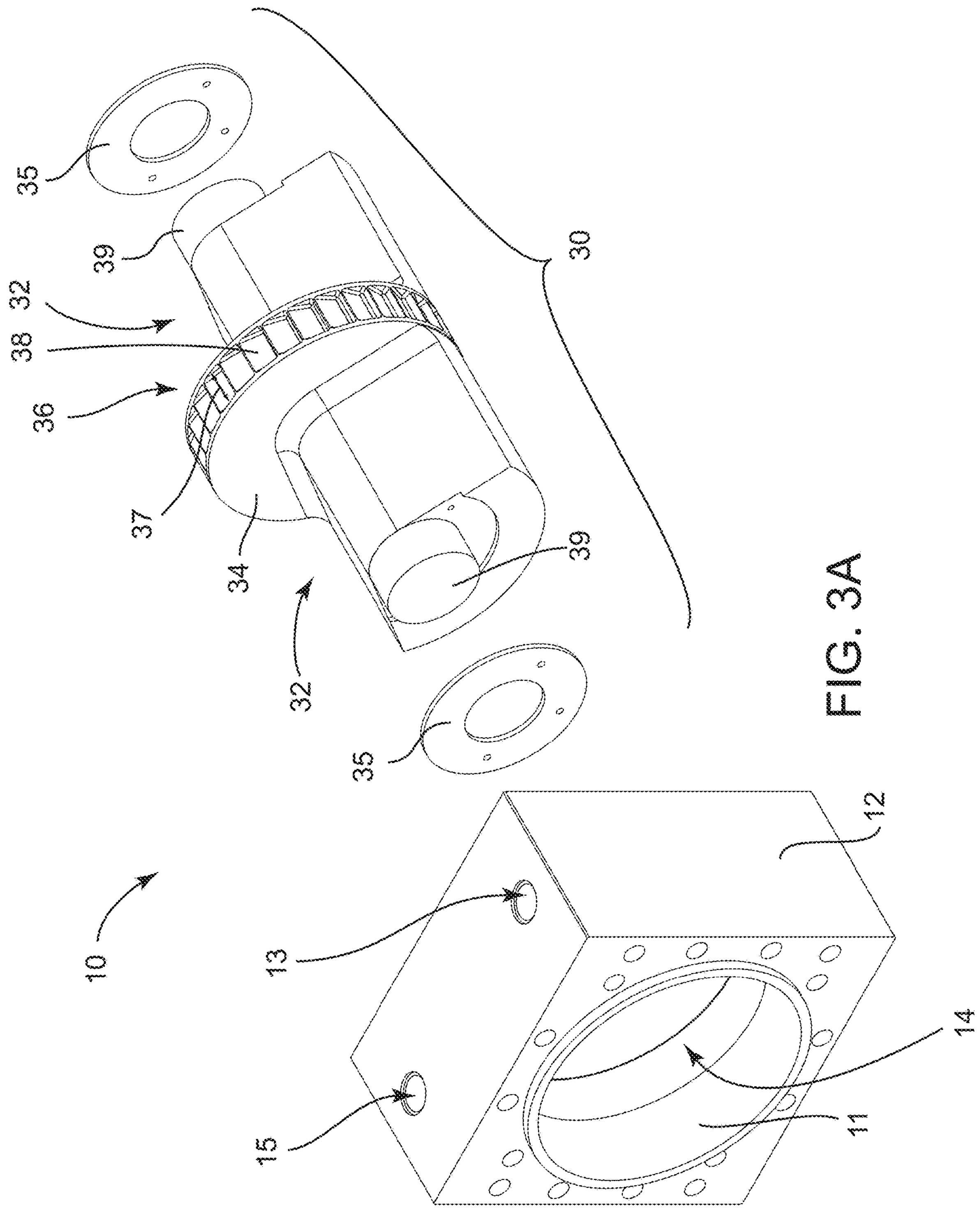
FIG. 3A is a perspective exploded view of a hydraulic vibration generating device according to an embodiment.
Figure 3B:
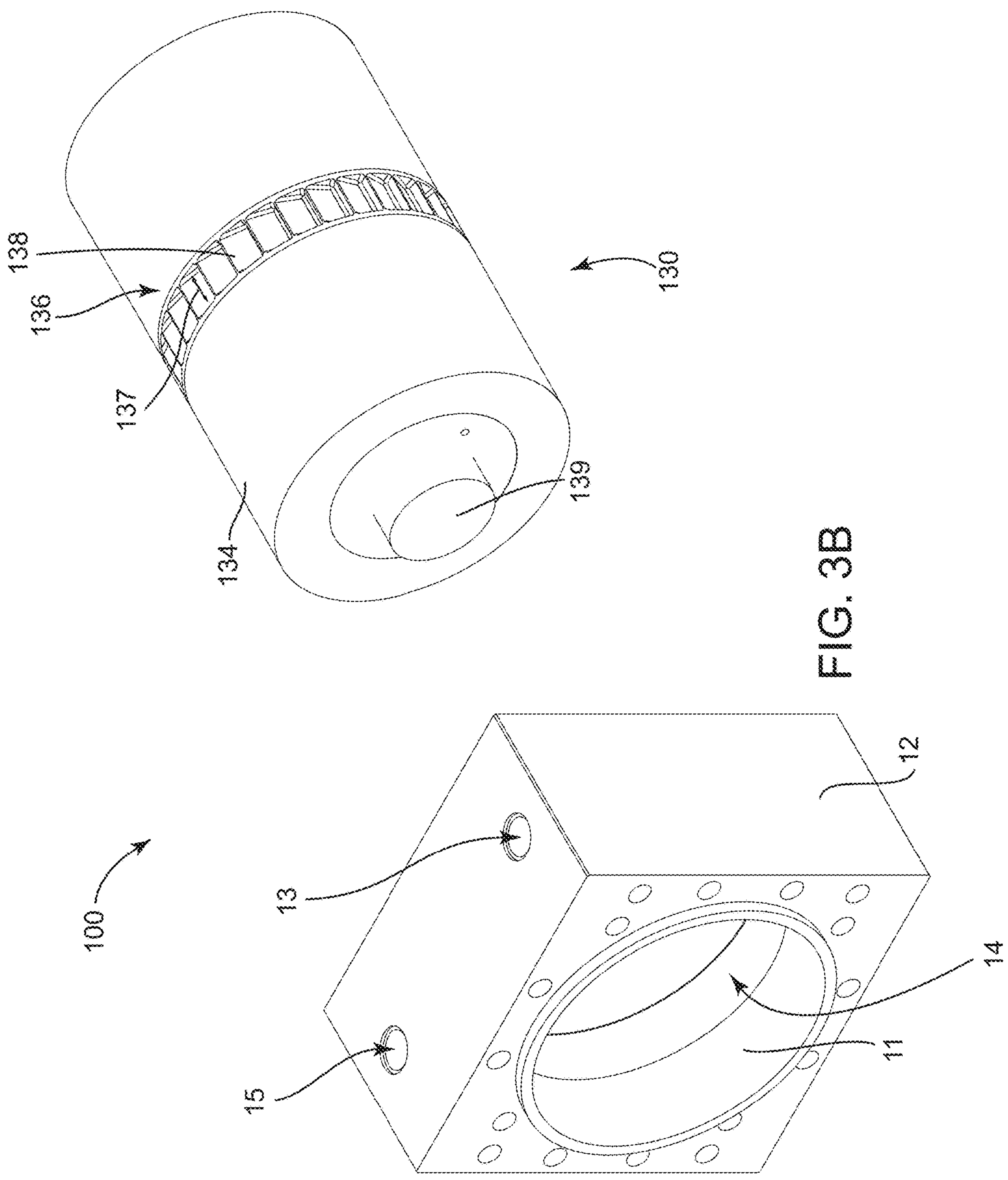
FIG. 3B is a perspective exploded view of a hydraulic motor according to an embodiment.

In another embodiment, shown in FIGS. 3B and 7 the vibration generating member 30 is replaced with a power generating member 130, formed as a spool, that comprises a solid shaft 134 and operates as a motor and can be coupled to an external device to supply power. The power generating member 130, formed as a spool, comprises a grooved drive 136 formed in the outer surface of the shaft 134 around a circumference of the shaft 134. The grooved drive 136 comprises a plurality of grooves 138 formed in the outer surface of the shaft 134 and are evenly spaced around the circumference of the shaft 134, such that hydraulic fluid may engage the grooves 138 to rotate the shaft 134 to generate power, such as through a drive shaft to supply power operate an external device. Further, the grooves 138 comprise a width 137 having the same characteristics as the width 37 of the grooves 38 of the vibration generating member 30. The operation of the manifold 12 with the pressure chamber 40 is the same in a hydraulic motor 100 as it is with vibration generating device 10 wherein the power generating member 130 is the same as the vibration generating member 30 without the off-center weight. This means that the method of operating a hydraulic motor with the manifold 12 is the same as the method of operating a hydraulic vibration generation device 30 with the manifold 12.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

The invention claimed is:

1. A hydraulic vibration generation device comprising:

a manifold comprising a fluid inlet orifice; a fluid outlet orifice; and an inner volume, wherein the inner volume defined by a cylindrical surface with a diameter;

a vibration generating member coupled within the inner volume of the manifold, wherein the vibration generating member is a shaft having a diameter that is smaller than the diameter of the cylindrical surface of the manifold, wherein the vibration generating member further comprises:

a grooved drive comprising a plurality of recessed grooves formed in an outer surface of the vibration generating member, wherein the recessed grooves of the plurality of recessed grooves are evenly spaced around the circumference of the vibration generating member; and a pressure chamber formed in the manifold, the pressure chamber comprising:

a pressure channel formed in the cylindrical surface of the inner volume, the pressure channel overlapping the fluid inlet orifice and extends below the fluid inlet orifice; and a seal extending form a first end of the pressure channel to above the fluid inlet orifice and on either side of the pressure channel, wherein:

the inner volume receives the vibration generating member within the inner volume locating the grooved drive adjacent the pressure channel such that flow of hydraulic oil is inhibited between the vibration generating member and the seal and directed through the pressure channel while engaging the grooved drive; and the vibration generating member rotates and generates vibration in response to hydraulic oil flowing through the fluid inlet orifice and into the pressure channel, through the pressure channel engaging the grooved drive to rotate the vibration generating member, out of the pressure channel where pressure is relieved as the hydraulic oil flows into and through a pressure relief channel formed in the cylindrical surface and extending from the pressure channel past the fluid outlet orifice, and out of the inner volume through the fluid outlet orifice.

2. The device of claim 1, the pressure channel comprises any length with a second end located between the fluid inlet orifice and the fluid outlet orifice.

3. The device of claim 1, wherein the pressure channel comprises a width.

4. The device of claim 3, wherein a width of the plurality of recessed grooves of the grooved drive is equal to or smaller than the width of the pressure channel.

* * * * *